United States Patent [19]
Gray

[11] Patent Number: 5,262,780
[45] Date of Patent: Nov. 16, 1993

[54] ANALOG TO DIGITAL CONVERTER WITH CONVERSION RATE INVERSE TO THE INTEGRATION PERIOD

[75] Inventor: Norman E. Gray, Anaheim, Calif.

[73] Assignee: Laurel Electronics, Inc., Newport Beach, Calif.

[21] Appl. No.: 920,008

[22] Filed: Jul. 27, 1992

Related U.S. Application Data

[63] Continuation of Ser. No. 627,697, Dec. 14, 1990.

[51] Int. Cl.$^5$ .............................................. H03M 1/50
[52] U.S. Cl. .................................... 341/166; 341/155
[58] Field of Search ............... 341/166, 167, 168, 169, 341/170, 128, 129, 155

[56] References Cited

U.S. PATENT DOCUMENTS 4,620,178 10/1986 Naito .................................... 341/167
5,014,058 5/1991 Horn ..................................... 341/166

Primary Examiner—A. D. Pellinen
Assistant Examiner—Brian K. Young
Attorney, Agent, or Firm—Lyon & Lyon

[57] ABSTRACT

The present invention provides an analog to digital converter including an integrator for charging and discharging a capacitor according to two currents of opposite direction containing a component of the analog input signal which is continuously connected. Also, a control circuit periodically switches on one current which remains until the integrator output reaches a reference level at which time the opposite direction current is switched on. A number of such cycles forms an integration period closely approximating a predetermined period. The control circuit measures the total amount of time of the integration period and also the accumulative amount of time that current flow is in a predetermined direction. From these two times, a digital representation of the analog input signal is calculated. The next integration period begins at the end of the previous to achieve a maximum conversion rate for a given integration period.

26 Claims, 7 Drawing Sheets

ANALOG TO DIGITAL CONVERTER WITH CONVERSION RATE INVERSE TO THE INTEGRATION PERIOD

This is a continuation of co-pending application Ser. No. 07/627,697, filed on Dec. 14, 1990, and now abandoned.

BACKGROUND OF THE INVENTION

1. Field of the Invention

This invention relates generally to analog-to-digital converters and, in particular, to such converters that utilize bi-directional integration to form a charge balance basis for voltage-to-time conversion.

2. Description of the Related Art

Various methods and systems have been devised to perform analog-to-digital conversion. There are feedback methods such as successive approximation and up-down counter tracking that use a digital-to-analog converter whose analog output is compared to the unknown analog signal and the digital input adjusted for minimum difference. When this is achieved the digital value represents the value of the analog input. These converters have short conversion times but quantization is unequal and cost increases rapidly with higher accuracy. There are direct conversion types such as flash or parallel converters that implement the analog-to-digital conversion by using a large number of comparators to achieve very high speed, however with the penalty of very high cost. There are Delta-Sigma types that use a 1-bit DAC in a high-speed charge balance loop whose quantized output is followed by an elaborate low pass digital filter to reduce the quantizing noise.

There are integration type analog-to-digital converters capable of high performance at low cost that operate at slower conversion rates suitable for use in digital multimeters, digital panel meters and other measurement instruments. These converters usually take advantage of their ability to integrate the input signal over one or more exact periods of the power line frequency to gain immunity to power line noise that is present with the input signal. Examples of integration-type converters are single slope, dual slope and multi-slope methods which are based on a voltage-to-time (V/T) conversion where the unknown input voltage is converted to a time period that is measured by counting a clock frequency. Another type is the voltage-to- frequency (V/F) converter that uses quantized charge feedback to balance the charge from the input signal in the integrator and create a frequency proportional to the input value. This frequency is then counted using a fixed timebase.

Ideal performance for the integration type converter could be achieved if it could continuously integrate the input signal over complete periods of the line frequency for power line noise rejection, convert each of these periods at the line frequency rate for high conversion speed and be capable of high resolution and accuracy at low cost. The present V/T converters such as dual slope and multi-slope achieve good linearity and high resolution but are unable to convert at the line frequency rate because they first integrate the signal over one (or more) line frequency periods and then spend the next period or two deintegrating a reference signal and auto-zeroing the circuit. Conversely, V/F converters are capable of converting at the line frequency rate by using consecutive time bases equal to the line frequency period but are unable to generate the high frequencies required for better than 0.01% resolution, while maintaining 0.01% linearity with low component cost.

SUMMARY OF THE INVENTION

Accordingly, the present invention provides a low cost integration-type microcomputer-based analog-to-digital converter that integrates the input signal over a predetermined period, and thereafter, without interruption or disconnection, continues integrating the input signal over the next equal period while completing the conversion process for the previous period. Since the integration periods are contiguous and a conversion is made for each integration period, the conversion rate is the inverse of the integration period. If the integration period is predetermined to be a line frequency period to achieve maximum power line noise rejection, the conversion rate is equal to the line frequency. Thus the present invention achieves the high linearity and resolution qualities of the V/T converters combined with the higher line frequency conversion rate capability of V/F converters.

Accordingly, it is a object of the present invention to provide an improved analog to digital converter.

It is another object of the present invention to provide an improved analog to digital converter using readily available and standard components.

It is still another object of the present invention to provide an analog to digital converter utilizing inexpensive components and a microcomputer. It is still another object of the present invention to provide an improved low cost integration-type microcomputer-based analog to digital converter utilizing standard components achieving high linearity and resolution qualities, along with the higher line frequency conversion rate capability of V/F converters. These and other objects of the present invention will become more apparent when taken in conjunction with the following description and attached drawings, wherein like characters indicate like parts and which drawings form a part of the present application.

DESCRIPTION OF THE PREFERRED EMBODIMENT

DETAILED DESCRIPTION OF THE DRAWINGS

Figure 1:
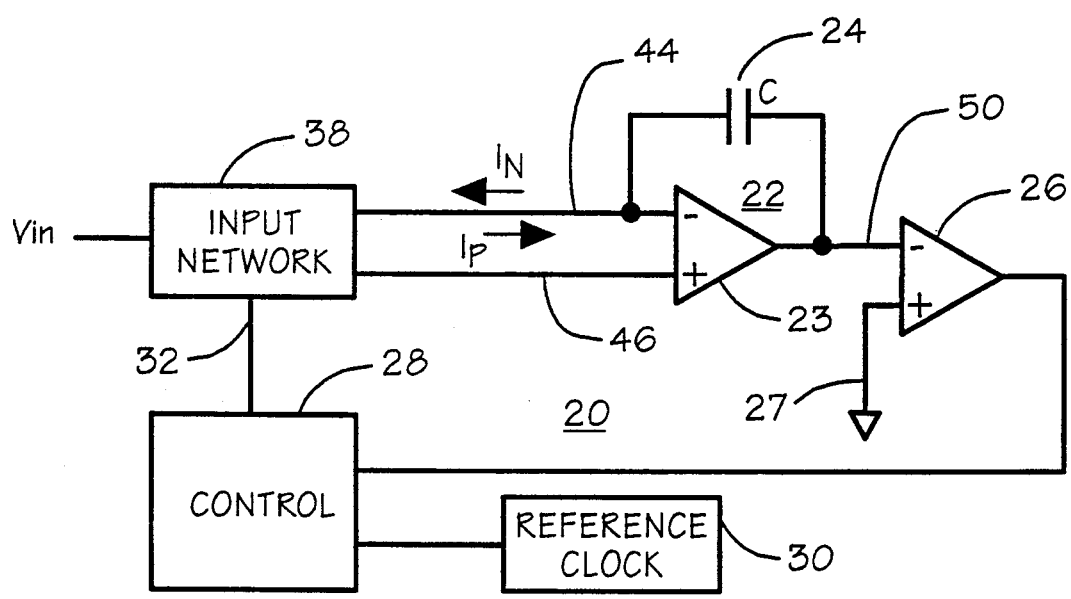
FIG. 1 is a block diagram of the analog-to-digital converter.

Turning now to the drawings, FIG. 1 is a block diagram of an analog-to-digital converter 20 that includes an integrator 22 comprising an operational amplifier 23 and an integrating capacitor 24 coupled to a comparator 26 which is coupled to a control circuit 28 having a reference clock 30. Control circuit 28 is coupled to an input circuit 38 that provides, depending on switch control input 32, either a current IP that flows toward, or a current IN that flows away from, a summing junction 44 of integrator 22. Input network 38 also couples to a voltage input 46 of integrator 22.

Figure 2A:
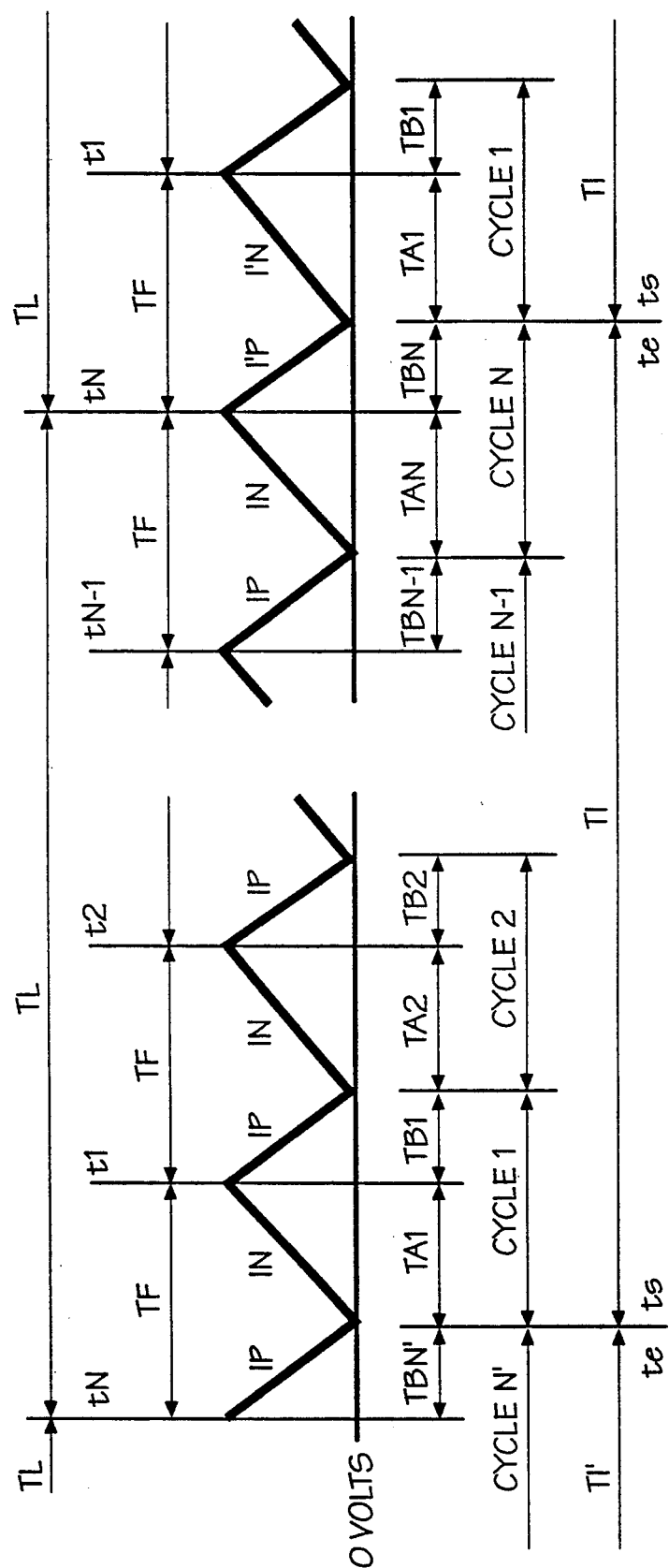
FIGS. 2A through 2C are typical timing waveforms for the embodiment of the present invention.

FIG. 2A illustrates output waveform 50 of integrator 22 resulting from currents IP and IN. There are an integral number N of equal frame time intervals TF in one line frequency period TL. There are also N cycles in one integration period TI, of which cycle 1 is typical. Integration period TI starts at start time ts and ends at end time te. Time TB (e.g. $TB_1$, $TB_2$) represents the time current IP flows and time TA (e.g., $TA_1$, $TA_2$) represents the time current IN flows. Time TBN is the time current IP flows in the last cycle N, and is also the time from tN at the end of line frequency period TL to the time te at the end of integration period TI. Time TBN' in cycle N' is the equivalent time for the previous integration period TI'.

Figure 2B:
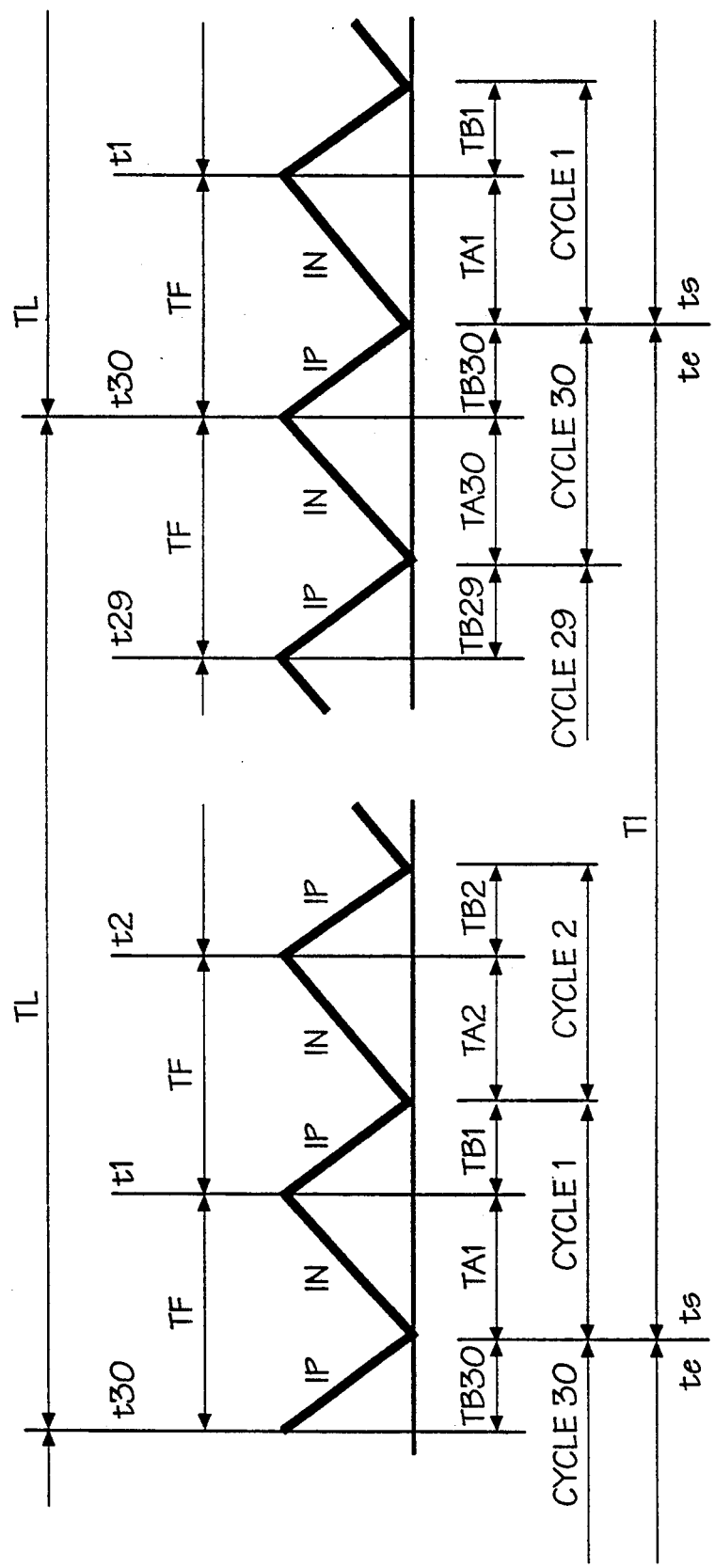

FIG. 2B also illustrates output waveform 50 of integrator 22 resulting from currents IP and IN except this Figure represents a specific embodiment having N=30 frame time intervals TF in one line frequency period TL. The last two cycles of the integration period TI are cycle 29 and cycle 30.

Figure 2C:
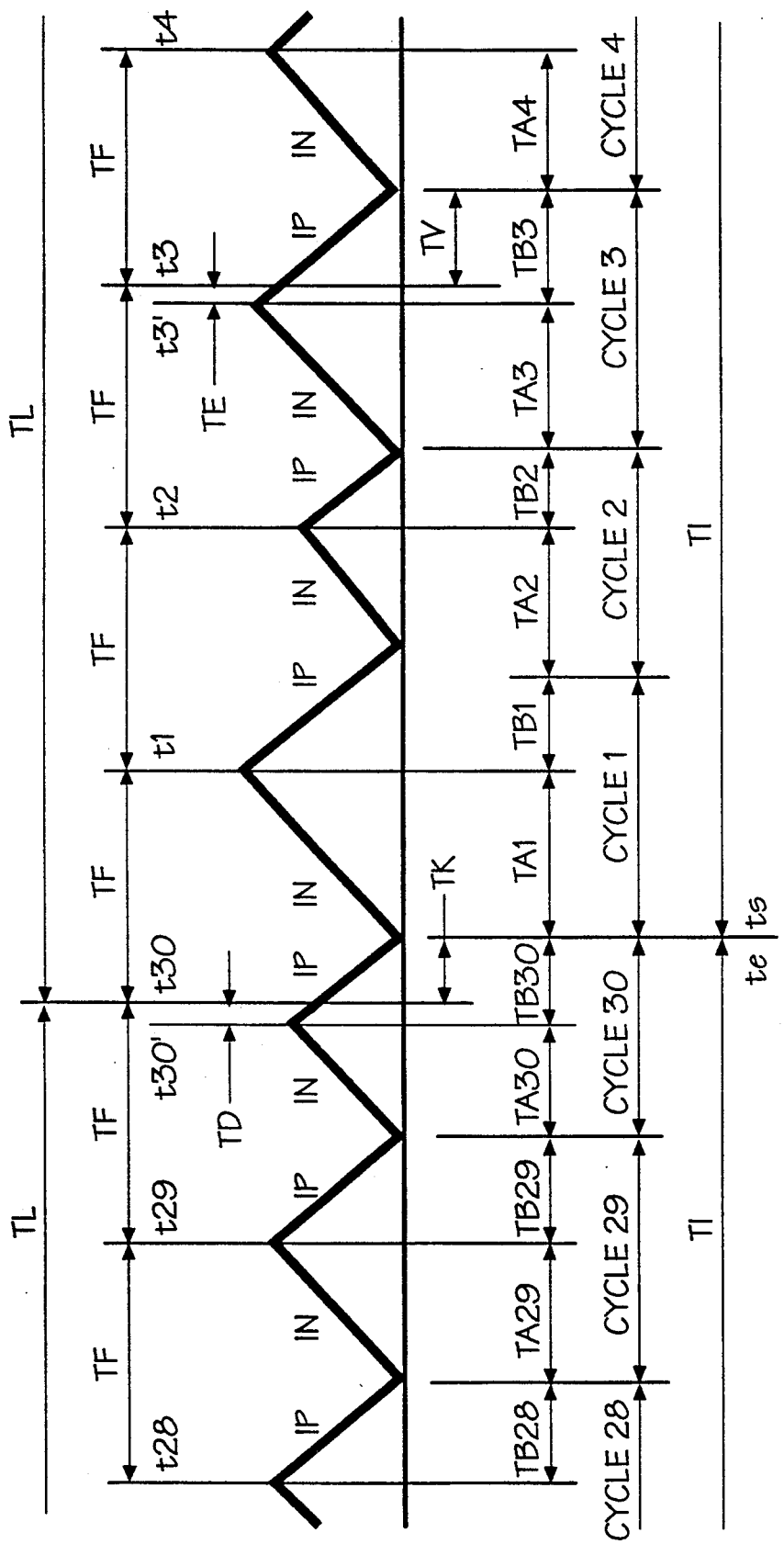

FIG. 2C also illustrates output waveform 50 of integrator 22 resulting from currents IP and IN except this Figure represents a specific embodiment which, instead of switching from IN to IP at time t30, switches at time t30', a correction time TD earlier or later, causing a comparator reference crossing at a time TK following t30. Likewise, instead of switching from IN to IP at time t3, it switches at t3', a correction time TE earlier or later, resulting in a comparator reference crossing at a time TV after time t3.

Figure 3:
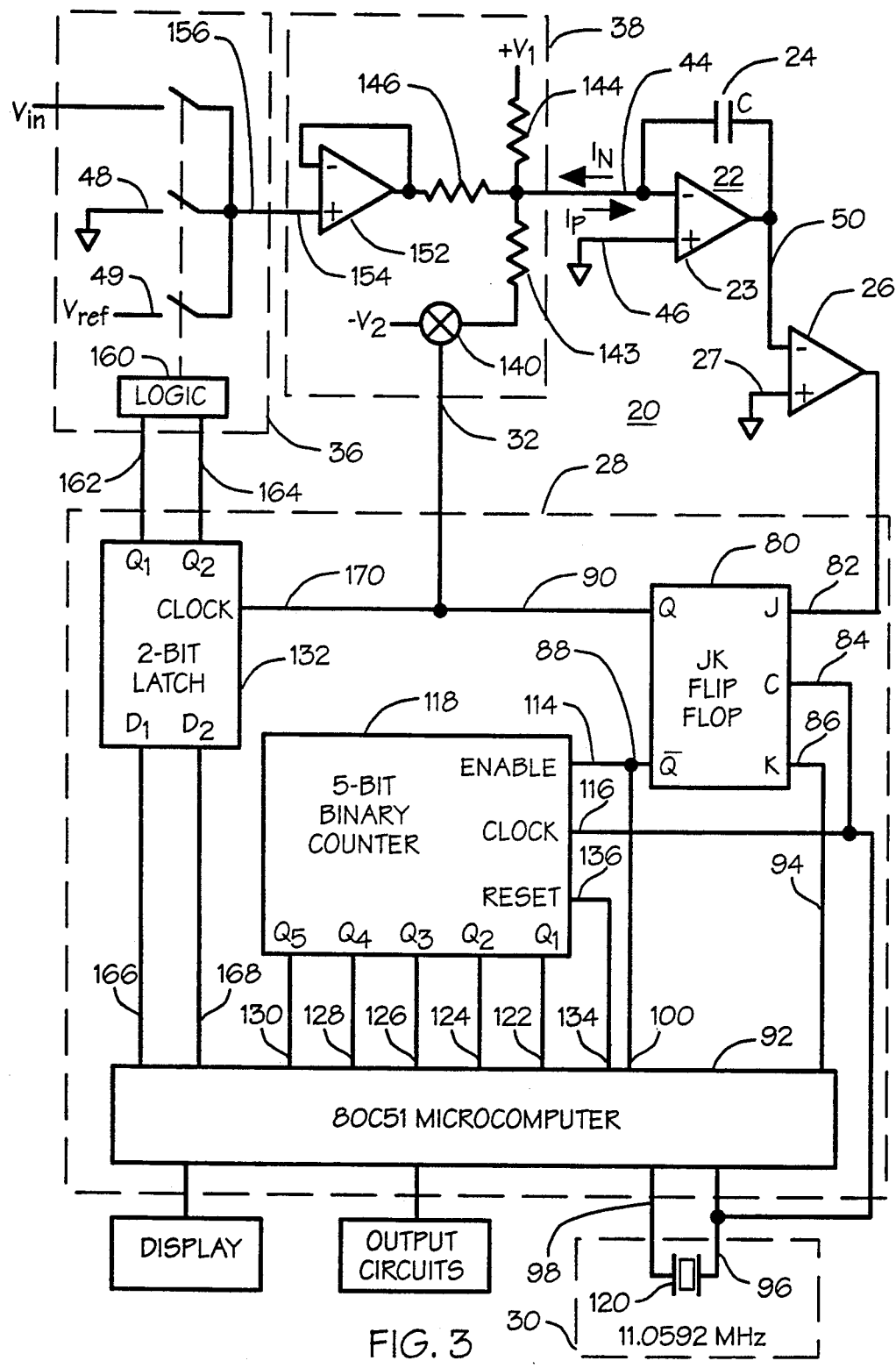
FIG. 3 is a schematic of the preferred embodiment.

FIG. 3 is a preferred embodiment of the invention, having integrator 22 coupled to comparator 26 which in turn is coupled to control circuit 28 in general, and in particular to a J input 82 of a JK flip-flop 80 that has a clock input 84 coupled to a clock output 96 of a microcomputer 92. Reference clock 30 comprises an 11.0592 MHz crystal 120 coupled between a clock input 98 and clock output 96 of microcomputer 92 which has a frame start output 94 coupled to a K input 86 of JK flip-flop 80. JK flip-flop 80 has a Q output 90 coupled to input network 38 in general, and in particular to a negative reference switch 140 and has a $\bar{Q}$ output 88 coupled to both an interrupt input 100 of microcomputer 92 and an enable input 114 of a 5-bit binary counter 118. Clock output 96 of microcomputer 92 is coupled to a clock input 116 of 5-bit binary counter 118. Binary output stages 122,124,126,128, and overflow output 130 of 5-bit binary counter 118 are coupled to microcomputer 92 input ports. Reset output 134 of microcomputer 92 is coupled to reset input 136 of 5-bit binary counter 118.

Negative reference switch 140 couples a negative reference voltage −V2 to a resistor 143 coupled to summing junction 44. An offset resistor 144 is coupled at one end to a positive reference voltage +VI and at the other end to summing junction 44. An input resistor 146 is coupled at one end to a buffer amplifier 152 and at the other end to summing junction 44. An input 154 of buffer amplifier 152 is coupled to a select output 156 of a select circuit 36 that has an input voltage Vin, a ground reference signal 48 and a reference Vref coupled to it. Select circuit 36 has logic control 160 inputs coupled to 2-bit latch 132 Q1 output 162 and Q2 output 164. The 2-bit latch 132 input D1 166 and input D2 168 are coupled to microcomputer 92 output ports and the latch clock input 170 is coupled to Q output 90.

Figure 4A:
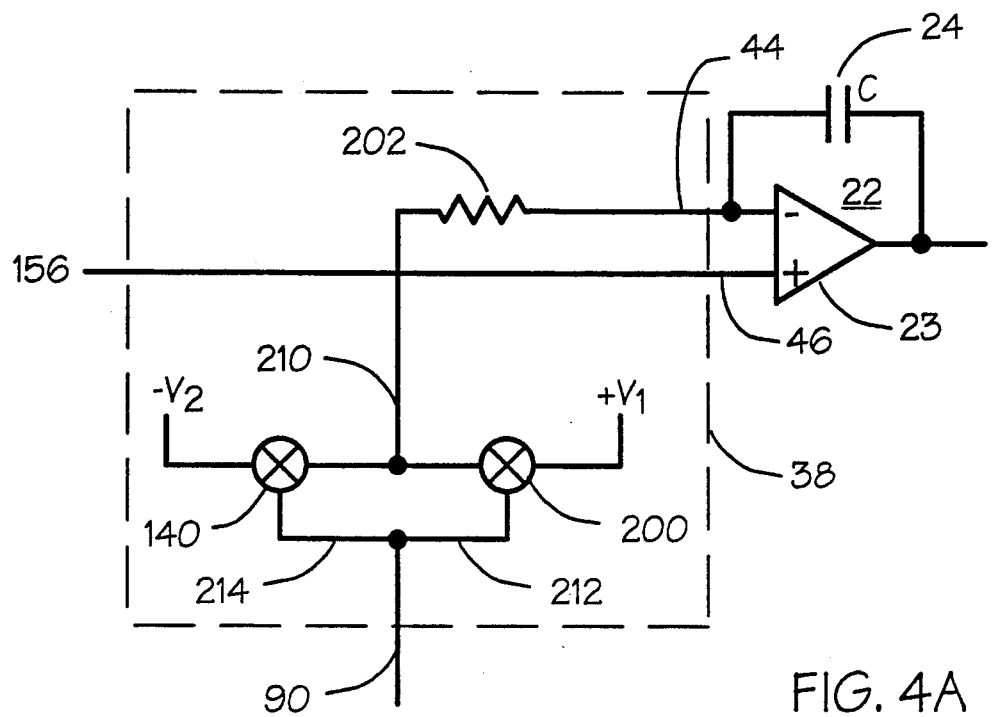
FIGS. 4A through 4D are alternative input network configurations that satisfy the requirements of the present invention.
Figure 4B:
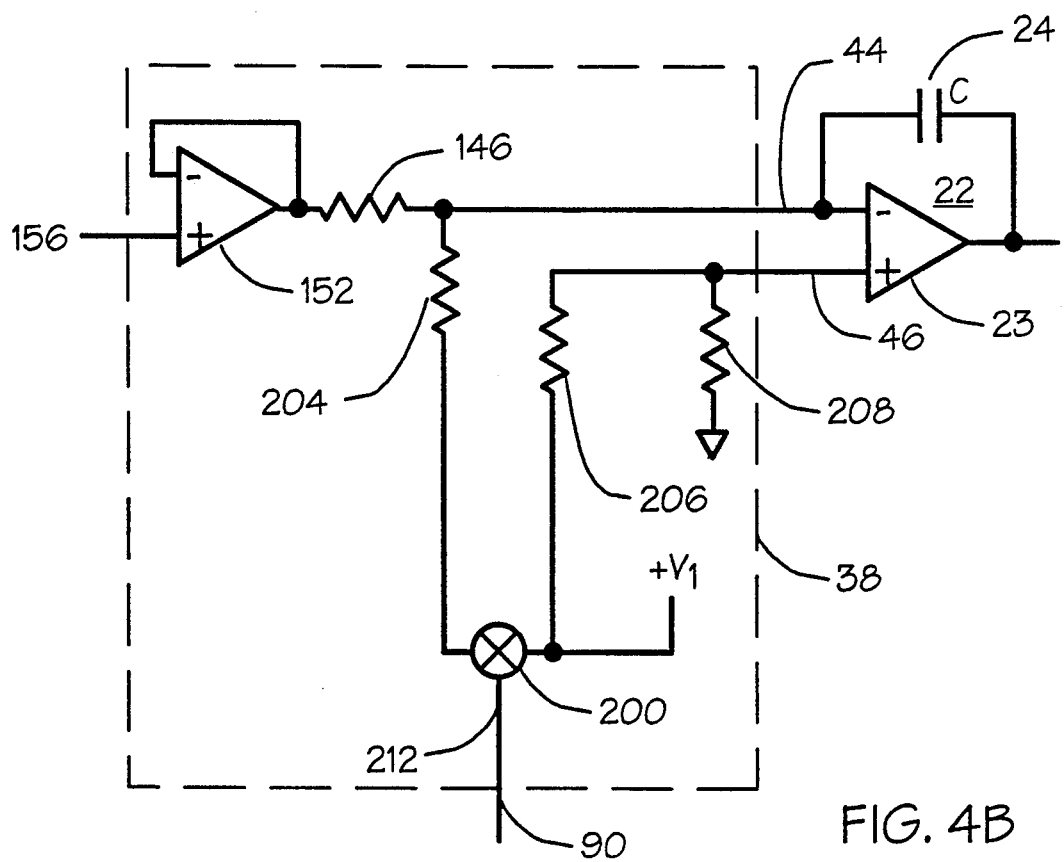

FIG. 4A is another embodiment of input network 38 and reference switches 34. Select output 156 is coupled to voltage input 46 of operational amplifier 23. A resistor 202 is coupled at one end to summing junction 44 and at the other end to a common junction 210 of a positive reference switch 200 and negative reference switch 140. Positive reference switch 200 also couples to positive reference voltage +V1 and a positive switch control input 212 couples to Q output 90. Negative reference switch 140 also couples to negative reference voltage −V2 and a negative switch control input 214 couples to Q output 90.

FIG., 4B is still another embodiment of input network 38. Select output 156 is coupled to buffer amplifier 152 whose output is coupled to one end of input resistor 146, the other end of which is coupled to summing junction 44. A resistor 204 is coupled at one end to summing junction 44 and at the other end to positive reference switch 200 which in turn couples to positive reference voltage +V1 while a positive switch control input 212 couples to Q output 90. Positive reference voltage +V1 also couples to one end of a resistor 206 whose other end couples to a resistor 208 and to voltage input 46 of operational amplifier 23. The other end of resistor 208 couples to ground.

Figure 4C:
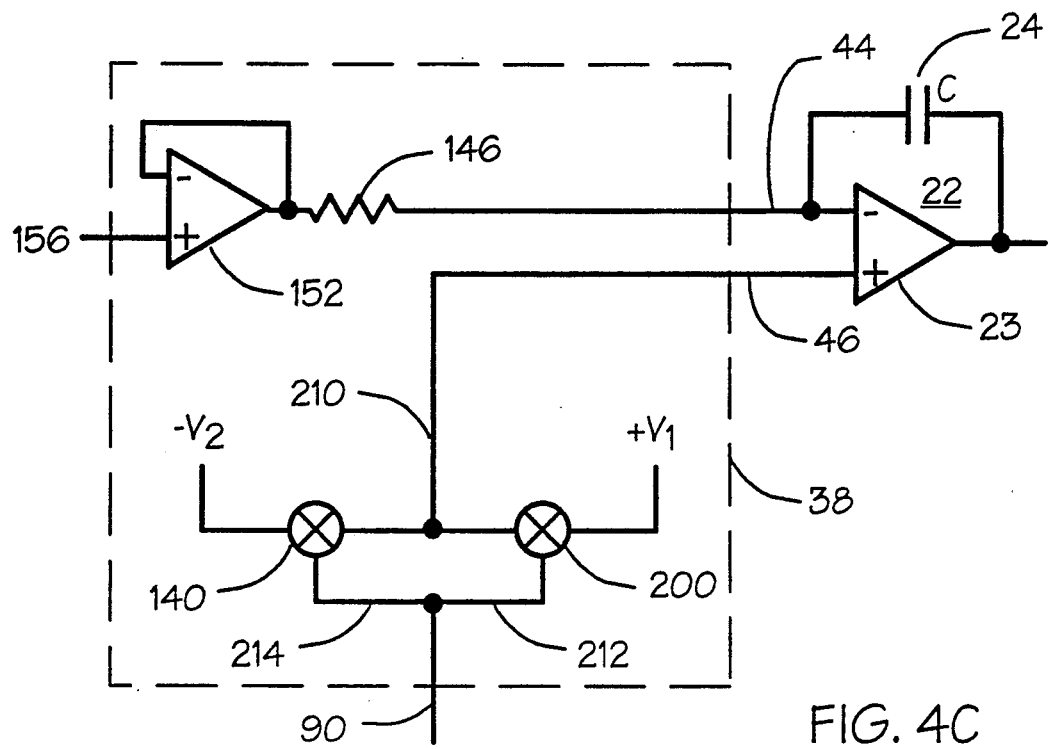

FIG. 4C is yet another embodiment of input network 38. Select output 156 is coupled to buffer amplifier 152 whose output is coupled to one end of input resistor 146 whose other end is coupled to summing junction 44. Voltage input 46 of operational amplifier 23 is coupled to a common junction 210 of positive reference switch 200 and negative reference switch 140. Positive reference switch 200 also couples to positive reference voltage +V1 and a positive switch control input 212 couples to Q output 90. Negative reference switch 140 also couples to negative reference voltage −V2 and negative switch control input 214 couples to Q output 90.

Figure 4D:
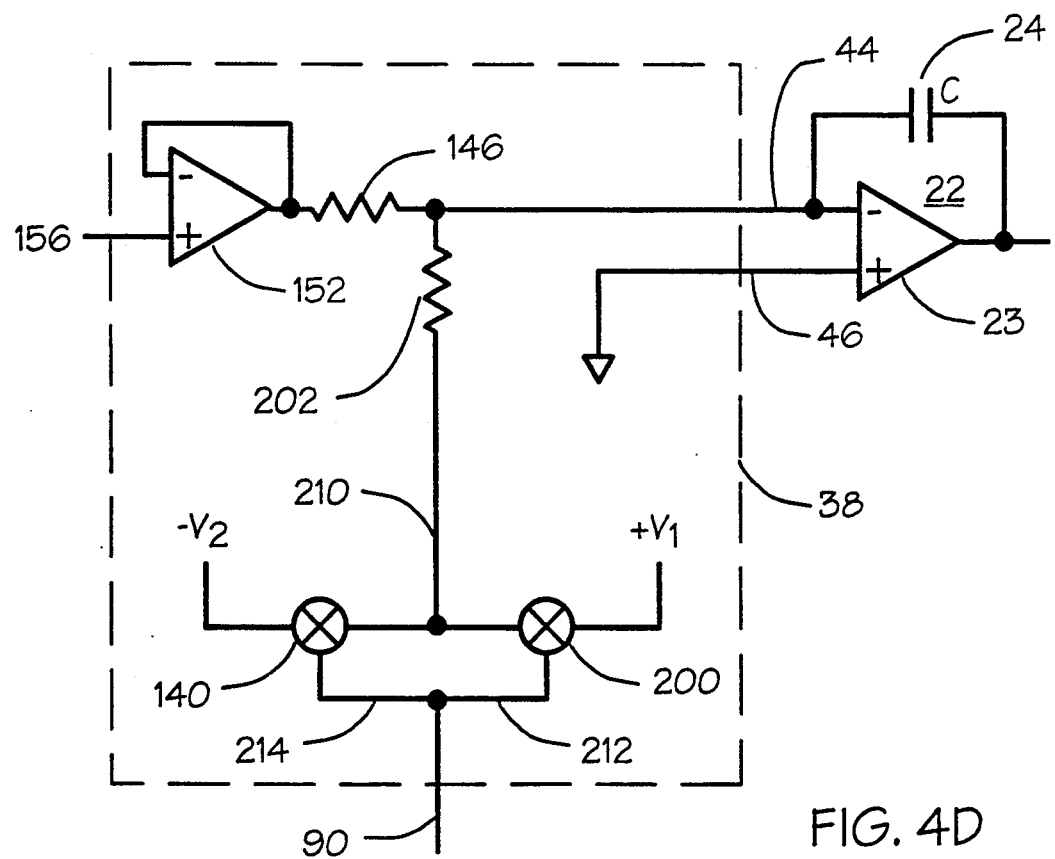

FIG. 4D is yet another embodiment of input network 38. Select output 156 is coupled to buffer amplifier 152 whose output is coupled to one end of input resistor 146 whose other end is coupled to summing junction 44. Voltage input 46 of operational amplifier 23 is coupled to ground. A resistor 202 is coupled at one end to summing junction 44 and at the other end to common junction 210 of positive reference switch 200 and negative reference switch 140. Positive reference switch 200 also couples to positive reference voltage +V1 and a positive switch control input 212 couples to Q output 90. Negative reference switch 140 also couples to negative reference voltage −V2 and a negative switch control input 214 couples to Q output 90.

Operation of the Invention

The general analog-to-digital conversion process is described according to the block diagram of FIG. 1 with reference to FIG. 2A which shows a typical waveform of integrator 22 output signal for a steady unknown input voltage Vin that is continuously coupled to input network 38. The control circuit 28 applies a logic level to the switch control input 32 of the input network 38 to cause current IP to switch on at equally spaced frame time intervals t1, t2, t3, ... tN, t1, t2, etc. The current IP causes integrator 22 output signal to start its negative slope. When it reaches zero volts, or another voltage if the comparator 26 voltage reference input 27 is different from zero, the comparator 26 output switches states and causes control circuit 28 to apply the opposite logic level to switch control input 32 to cause current IP to turn off and current IN to turn on. Current IN causes integrator 22 output signal to start its positive slope and comparator 26 reverts to its previous state while the control circuit 28 maintains switch control input 32 in the position of current IN on. When control circuit 28 determines that predetermined frame time interval TF has elapsed, it again changes the level of the switch control input 32 of the input network 38 to cause current IP to switch on and current IN to switch off. Input voltage Vin is continuously coupled to integrator 22 by input network 38 while one or more reference currents in input network 38 are switched by switch control input 32 to form bi-directional currents IP and IN.

Line frequency period TL is divided into an integral number of frames N, each of equal frame time interval TF. An integration period TI starts at a time ts when comparator 26 switches and the charge on integrating capacitor 24 is at a repeatable value. This is the beginning of cycle 1 which ends when comparator 26 again switches and the charge on integrating capacitor 24 is back to the same repeatable value. An integration period ends at a time te after N cycles have occurred, and when the charge on integrating capacitor 24 is once more at the same repeatable value. It is observed that if time TBN'; during which current IP is on in cycle N' of the previous integration is the same as the time TBN, during which current IP is on in cycle N of the current integration, that the integration period TI is exactly the same as line frequency period TL.

Charge balance equations written in terms of current IP, current IN and frame time interval TF result in a geometric series representation of the value of TB after i frames assuming an initial value of TB=TB0.

$$TBi = \frac{TF \times IN}{IP + IN} \left[ 1 - \left[ -\frac{IN}{IP} \right]^i \left[ 1 - \frac{IP + IN}{IN} \times \frac{TB0}{TF} \right] \right] \quad (1)$$

The series converges and the system is stable for the condition $$\frac{IN}{IP} < 1 \text{ or } |IN| < |IP| \quad (2)$$

where IN and IP are positive values. Assuming this criteria is met, the steady state value of TB (i—>) is $$TB = \frac{TF \times IN}{IP + IN} \quad (3)$$

and TB is less than TF/2 and less than TA as shown in FIG. 2A. If the value of IN/IF is allowed to become greater than 1, TB grows alternately larger and smaller than its average value, according to the term $$1 - \left[ -\frac{IN}{IP} \right]^i$$

in equation (1) above for TBi and the system is unstable.

For the embodiment of input network 38 suggested in FIG. 3, charge balance equations in the form of integrals of IP and IN may be written for each cycle of an integration period TI and then IP and IN replaced with their equivalent expressions in terms of the circuit constants and, the input voltage Vi(t), The result is an expression for unknown input voltage of the form $$Vin = K1 \times \left[ \frac{\sum_{i=1}^{N} TBi}{TI} + K2 \right] \quad (4)$$

where constants K1 and K2 represent combinations of resistor values and reference voltages of input network 38. These resistor values and reference voltages are chosen in combination such that over the full scale range of input voltage Vin (1) current IN remains less than current IP to satisfy system stability requirements and (2) TB covers a wide range within its limits of 0 to TF/2 to provide highest resolution. A range of TB=0.1 TF—to TB=0.4 TF is wide yet leaves some margin for component tolerances and input voltage overload and underload. This invention works for any embodiment of input network 38 that results in the form of equation (4) for Vin. Examples of other embodiments having this form of equation appear in FIGS. 4A, 4B, 4C and 4D.

Returning to FIGS. 1 and 2A, by counting pulses of reference clock 30, control circuit 28 creates a numerator value by summing the time periods of each TBi over integration period TI and creates a denominator value from the total time of integration period TI and then calculates the quotient, adds K2 and multiplies by K1 to complete the analog-to-digital conversion. Since TBi=TF—TAi and frame time interval TF is a constant, control circuit 28 could, as an alternative, sum the time periods of each TAi in place of each TBi and then the equation for input voltage Vin is $$Vin = K1 \times \left[ 1 - \frac{\sum_{i=1}^{N} TAi}{TI} + K2 \right]$$

The information required to make the calculation of Vin from equation (4) is available at the end of integration time TI, so the next integration period can start immediately and proceed while this calculation is in progress. Thus the conversion rate is once per line frequency period or equal to the line frequency. This invention also applies to predetermined periods other than the line frequency period TL. For example, a shorter predetermined period results in a conversion rate higher than the line frequency but at the sacrifice of power line noise rejection.

Operation of the Preferred Embodiment

More specifically, FIG. 3 is an embodiment of the invention capable of 0.01% resolution and linearity while integrating the input signal over each line frequency period and converting at the line frequency rate. Referring also to FIG. 2B, having N=30 frames per line frequency period TL, integration period TI starts at time ts when integrator 22 output decreases to zero volts causing comparator 26 output to go high at J input 82 of JK flip-flop 80. The next clock output 96 from microcomputer 92 toggles the flip-flop causing Q output 90 to go high and close the negative reference switch 140 and turn on current IN flowing away from summing junction 44 because the current in resistor 143 is chosen to exceed the maximum current flow through offset resistor 144 and input resistor 146 toward summing junction 44.

The integrator 22 output reverses to a positive direction causing the comparator 26 output to return low. $\overline{Q}$ output 88 of JK flip-flop is now low and couples (1) to enable input 114 of 5-bit binary counter 118 to disable and hold its count and (2) to interrupt input 100 of microcomputer 92 to force an interrupt routine (see program steps 300-360, Table 1). Assuming this is cycle 1, program steps 351 to 358 are executed to conclude the previous conversion by calculating and publishing the converted digital value. The routine also resets an internal counter of microcomputer 92 and causes reset output 134 to reset 5-bit binary counter 118. This counter is included in control circuit 28 to provide a clock frequency divided down sufficiently to be reliably counted by the microcomputer internal counter. The latter extends the count to more significant bits by counting the negative transitions of overflow output 130 of 5-bit binary counter 118. A timer internal to microcomputer 92 initiates frame start output 94, coupled to K input 86 of JK flip-flop 80, at equal frame time intervals TF of 16666.7 us/30 frames=555.56 us for 60 Hz line frequency 20000.0 us /36 frames=555.56 us for 50 Hz line frequency When frame start output 94 occurs at time t1, the next clock output 96 toggles the JK flip-flop causing Q output 90 to go low and open negative reference switch 140 to make current IP active. Q̄ output 88 goes high to enable 5-bit binary counter 118 to start counting the clock output 96 and accumulating the TB1 time. Overflows are accumulated in the microcomputer 92 internal counter. The 5-bit binary counter and the internal counter in tandem are not reset until the final count is read at the end of integration period 54 but are enabled for accumulative counting during each TBi period and disabled from counting during each TAi period.

TABLE 1

| 300 | Increment cycle counter |
|---|---|
| 301 | If cycle counter = 31 then set cycle counter = 1 |
| 340 | If not cycle 30 then go to 350 |
| 341 | Read total count in counters and store in CNT29 |
| 345 | Return to main program |
| 350 | If not cycle 1 then go to 360 |
| 351 | Read total count in counters and store in CNT30 |
| 352 | Calculate NEW TB30 = CNT30 − CNT29 |
| 353 | Calculate TI = TL + NEW TB30 − OLD TB30 |
| 354 | Store NEW TB30 in OLD TB30 for next conversion |
| 355 | Calculate V = K1 × (CNT30/TI + K2) |
| 356 | Convert V to decimal digits and display |
| 357 | Send V to output circuits |
| 358 | Reset counters to zero |
| 360 | Return to main program |

When integrator 22 output decreases to zero volts, causing comparator output 26 to go high, the previous description is repeated except the cycle number is now 2 and the microcomputer interrupt routine, (see TABLE 1), skips all indented instructions until cycle 30. When cycle 30 is reached, instruction 341 causes the number of counts in both 5-bit binary counter 118 and microcomputer 92 internal counter to be read and the total count-stored as CNT29. At the end of integration, time te, instruction 351 causes the total count to be read and stored as CNT30. The NEW TB30=CNT30−CNT29 is calculated in instruction 352 and used together with the OLD TB30, that was saved from the previous conversion, to calculate the present integration period TI in instruction 353. The NEW TB30 of this conversion and the OLD TB30 of the previous conversion are theoretically equal and in practice are close or equal to the same value but to maintain highest accuracy in this embodiment, the difference, which may represent a minor deviation of integration period TI from the line frequency period TL, is included in the time-to-voltage calculation of instruction 355 by using the actual TI instead of TL. The effect of this small deviation on the line frequency noise rejection is negligible.

Drift of resistor values and reference voltages of input network 38 affect the gain constant K1 and offset constant K2 of the conversion calculation, line 355 of TABLE 1. To compensate for this drift, input select circuit 36, under control of microcomputer 92, occasionally uncouples the unknown input voltage 47 and couples the ground reference signal 48 to input network 34 and the system makes a conversion. The value of this conversion is used to update the offset constant K2. Likewise, an occasional conversion is made with voltage reference Vref coupled to input network 34 by select circuit 36. The value of this conversion is used to update the gain constant K1. For highest accuracy and to avoid wasting any integration periods, select circuit 36 must synchronously switch these input voltages only at time ts, the beginning of integration period TI. This is accomplished by means of a 2-bit latch 132 that is clocked by Q output 90 occurring at that time. Microcomputer 92 sets the desired inputs to 2-bit latch 132 just prior to time ts.

Performing occasional conversions of ground reference 48 and voltage reference 49 for drift compensation produces a significant difference in the OLD TB30 and NEW TB30 values when the select circuit switches from one input voltage value to another. This difference becomes a deviation of the integration period TI from the line frequency period TL. This deviation does not affect the accuracy of the conversion because TI is the correct value to be used in the calculation. It does affect the line frequency noise rejection to a small extent because the input signal integration time is not exactly a line frequency period. The maximum time deviation, if the full scale range of TB varies from 0.1 TF to 0.4 TF, is 0.3 TF deviation divided by 30 TF periods or 1% for this embodiment of 30 frames per line frequency period. The worst case effect of line frequency noise then introduces an error of 1% of its peak value. If the noise amplitude is less than 1% of the input full scale range then the error is less than 0.01% of full scale and may be disregarded. Otherwise, to eliminate errors created by noise amplitudes higher than 1% of the full scale range, the integration period must be made the same as the line frequency period.

One method for achieving equal integration and line frequency periods is to ignore the first conversion each time the input voltage is synchronously changed and use the remaining conversions for which the OLD TB30 and NEW TB30 are essentially equal because the transient term of equation (1) becomes negligible after 30 frames. However, this wastes an integration period each time the input voltage is changed. Another method, which is part of this invention, is to end each integration period, regardless of the input voltage and values of current IP and IN, at a fixed time TK after t30, referring now to FIG. 2C. Then the integration period TI is the same as the line frequency period TL because NEW TK−OLD TK=0 for a constant time TK. To ensure that integrator 22 reaches zero volts at constant time TK after t30, microcomputer 92 first measures TB29, calculates a correction time TD and sends frame start output 94 early at time t30′=t30 −TD instead of time t30. This causes JK flip-flop 80 to change states early and Q output 90 to open negative reference switch 140 to turn on current IP early. The controlled result is that integrator 22 output will decrease to the comparator reference at time TK after t30. The equation for correction time TD to cause constant time TK is derived from the charge balance equations for cycles 29 and 30 and the steady state value TB=TF×IN/(IP+IN). Assuming TB28=TB29, the equation reduces to $$TD = \frac{-(TB29)^2 + TB29(TF + TK) - TK \times TF}{TF} \quad (6)$$

The value of TB29 is determined by reading the total count, TB1 through TB28, in the counters at the beginning of cycle 29, and the total count, TB1 through TB29, in the counters at the beginning of cycle 30, and taking the difference. See Table 2 for expanded program steps of the interrupt routine, in particular instructions 331-322 and 341-345. The arbitrary value of TK is pre-selected to occur somewhere between the limit values of TB, 0 to TF/2. Therefore, TD can have either sign and cause current IP to turn on late as well as early to create time TK, depending on the value of the input voltage. This correction is applied every integration period so the OLD TK and NEW TK remain equal as the input voltage is changed and every integration period TI is equal to lien frequency period TL producing maximum line frequency noise rejection.

TABLE 2

| | |
|---|---|
| 300 | Increment cycle counter |
| 301 | If cycle counter = 31 then set cycle counter = 1 |
| 310 | If not cycle 2 then go to 320 |
| 311 | Read total count in counters and store in CNT1 |
| 312 | Return to main program |
| 320 | If not cycle 3 then go to 330 |
| 321 | Read total count in counters and store in CNT2 |
| 322 | Calculate TB1 = CNT1 |
| 323 | Calculate TB2 = CNT2 − CNT1 |
| 324 | Calculate $TE = \frac{-(TB2)^2(TB2 - TB1)}{(TF + TB2 - TB1)^2}$ |
| 325 | Apply correction TD to frame start output timer |
| 326 | Return to main program |
| 330 | If not cycle 29 then go to 340 |
| 331 | Read total count in counters and store in CNT28 |
| 332 | Return to main program |
| 340 | If not cycle 30 then go to 350 |
| 341 | Read total count in counters and store in CNT29 |
| 342 | Calculate TB29 = CNT29 − CNT28 |
| 343 | Calculate $TD = \frac{-(TB29)^2 + TB29(TF + TK) - TK \times TF}{TF}$ |
| 344 | Apply correction TD to frame start output timer |
| 345 | Return to main program |
| 350 | If not cycle 1 then go to 360 |
| 351 | Read total count in counters and store in CNT30 |
| 352 | Calculate NEW TB30 = CNT30 − CNT29 |

TABLE 2-continued

| | |
|---|---|
| 353 | Calculate TI = TL + NEW TB30 − OLDTB30 |
| 354 | Store NEW TB30 in OLD TB30 for next conversion |
| 355 | Calculate V = K1 × (CNT30/TI + K2) |
| 356 | Convert V to decimal digits and display |
| 357 | Send V to output circuits |
| 358 | Reset counters to zero |
| 360 | Return to main program |

However, applying correction time TD to create a constant integration end time TK introduces a TB0 transient term that appears in equation (1), and for values of IN/IP approaching 1, the TBi terms near the end of the integration may not yet be completely settled and the TB29 =TB30 assumption used in the time TD calculation may not be as good as desired. So another correction time TE, is calculated by microcomputer 92 and applied in a manner similar to TD, with the object that the negative slope of integrator 22 reaches the zero comparator reference at time TV at the end of cycle 3, where TV has the steady state value TV=TF×IN/(IP+IN). This forces waveform 50 to its steady-state condition and all cycles after cycle 3 have equal TBi. Then when time TD is calculated in cycle 30, the assumption TB28=TB29 is valid. The equation for the correction time TE is derived from the charge balance equations for cycles 2 and 3 and the steady state value TB=TF×IN/(IP+IN). The equation is $$TE = \frac{-(TB2)^2(TB2 - TB1)}{(TF + TB2 - TB1)^2} \quad (7)$$

Microcomputer 92 measures the value of TB1 by reading the total count in the counters at the beginning of cycle 2 and for the value of TB2 by reading the total count, TB1 plus TB2, in the counters at the beginning of cycle 3 and subtracting TB1. See Table 2 instructions 311-312 and 321-326. Later cycles can be used to adjust the waveform to its steady state value provided it is done before cycle 28 so that assumption TB28=TB29 is valid.

To reduce the software computational time of equations (6) and (7) for TD and TE, simplified calculations or table look-up approximating the results may be used.

Another embodiment adds the voltage from a temperature sensing circuit to select circuit 36 that is occasionally coupled to the input network and a conversion made to provide temperature compensation for the gain constant K1 and offset constant K2.

Yet another embodiment, with less resolution and accuracy, eliminates JK flip-flop 80, 5-bit binary counter 118 and 2-bit latch 132 from FIG. 3, leaving control circuit 28 comprised of only microcomputer 92 which then performs the functions of the omitted parts. This embodiment provides an alternative means for achieving times TX and TV by altering the time at which the switch control output switches from IP to IN to start cycles 30 and 3, instead of adjusting the frame start output 94 by times TD and TE.

APPENDIX

DERIVATION OF EQUATION (1) + (2)

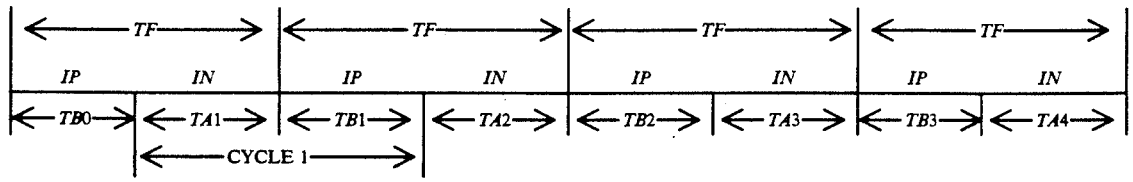

$IN \cdot TA1 = IP \cdot TB1$     Charge balance for CYCLE 1

$IN \cdot (TF - TB0) = IP \cdot TB1$ $TB1 = \frac{IN}{IP}(TF - TB0)$ $TB2 = \frac{IN}{IP}(TF - TB1) = \frac{IN}{IP}\left[TF - \frac{IN}{IP}(TF - TB0)\right] = \frac{IN}{IP}\left[TF - \frac{IN}{IP}(TF) + \frac{IN}{IP}(TB0)\right]$ $TB3 = \frac{IN}{IP}(TF - TB2) = \frac{IN}{IP}\left[TF - \frac{IN}{IP}(TF) + \left[\frac{IN}{IP}\right]^2 TF - \left[\frac{IN}{IP}\right]^2 TB0\right]$ $TB4 = \frac{IN}{IP}(TF - TB3) = \frac{IN}{IP}\left[TF - \frac{IN}{IP}(TF) + \left[\frac{IN}{IP}\right]^2 TF - \left[\frac{IN}{IP}\right]^3 TF + \left[\frac{IN}{IP}\right]^3 TB0\right]$ $TBN = \frac{IN}{IP}\left[TF - \frac{IN}{IP}(TF) + \left[\frac{IN}{IP}\right]^2 TF - \left[\frac{IN}{IP}\right]^3 TF + \ldots + \left[\frac{IN}{IP}\right]^{N-1} TF - \left[\frac{IN}{IP}\right]^{N-1} TB0\right]$ The sum of $n$ terms of a geometric series is $1 + r + r^2 + r^3 + \ldots r^{n-1} = \frac{(1 - r^n)}{1 - r}$ For $r = -\frac{IN}{IP}$     Series converges for $r^2 < 1$ or $IN < IP$ $$TBi = \frac{IN}{IP} TF \left[\frac{1 - \left[-\frac{IN}{IP}\right]^i}{1 - \left[-\frac{IN}{IP}\right]} - \left[-\frac{IN}{IP}\right]^{i-1} \frac{TB0}{TF}\right] \quad (2)$$

$$= \frac{IN}{IP}(TF)\left[\frac{IP\left[1 - \left[-\frac{IN}{IP}\right]^i\right]}{IP + IN} - \frac{\left[-\frac{IN}{IP}\right]^i}{-\frac{IN}{IP}} \frac{TB0}{TF}\right]$$

$$= \frac{TF \times IN}{IP + IN}\left[1 - \left[-\frac{IN}{IP}\right]^i + \frac{(IP + IN)}{IN(TF)}\left[-\frac{IN}{IP}\right]^i TB0\right]$$

$$= \frac{TF \times IN}{IP + IN}\left[1 - \left[-\frac{IN}{IP}\right]^i \times \left[1 - \frac{IP + IN}{IN} \times \frac{TB0}{TF}\right]\right] \quad (1)$$

$$\lim_{i \to \infty} TBi = \frac{TF \times IN}{IP + IN}\left[1 - \left[-\frac{IN}{IP}\right]^i \times \left[1 - \frac{TB0}{TF} \times \frac{IP + IN}{IN}\right]\right] = \frac{TF \times IN}{IP + IN} \quad (3)$$

EQUATION (4)

-continued

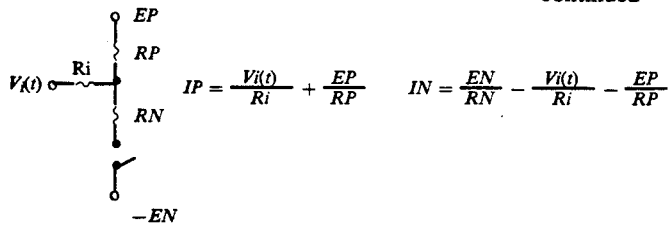

$$IP = \frac{Vi(t)}{Ri} + \frac{EP}{RP} \qquad IN = \frac{EN}{RN} - \frac{Vi(t)}{Ri} - \frac{EP}{RP}$$

$$\int_0^{t11}\left[\frac{EN}{RN} - \frac{EP}{RP} - \frac{Vi(t)}{Ri}\right]dt + \int_{t12}^{t21}\left[\frac{EN}{RN} - \frac{EP}{RP} - \frac{Vi(t)}{Ri}\right]dt + \ldots +$$

$$\int_{t(N-1)2}^{tN1}\left[\frac{EN}{RN} - \frac{EP}{RP} - \frac{Vi(t)}{Ri}\right]dt = \int_{t11}^{t12}\left[\frac{Vi(t)}{Ri} + \frac{EP}{RP}\right]dt + \int_{t21}^{t22}\left[\frac{Vi(t)}{Ri} + \frac{Ep}{Rp}\right]$$

$$dt + \ldots + \int_{tN1}^{tN2}\left[\frac{Vi(t)}{Ri} + \frac{EP}{RP}\right]dt - \frac{1}{Ri}\int_0^{tN2} Vi(t)dt = -\left[\left[\frac{EN}{RN} - \frac{EP}{RP}\right]TA1 - \right.$$

$$\frac{EP}{RP}(TB1) + \left[\frac{EN}{RN} - \frac{EP}{RP}\right]TA2 - \frac{EP}{RP}TB2 + \ldots \left[\frac{EN}{RN} - \frac{EP}{RP}\right]TAN - \frac{EP}{RP}TBN\right]$$

$$Vi\,\text{avg} = \frac{\int_0^{tN2} Vi(t)dt}{\sum_{i=1}^{N} TAi + \sum_{i=1}^{N} TBi} = \frac{Ri\left[\frac{EN}{RN}\sum_{i=1}^{N} TAi - \frac{EP}{RP}\left[\sum_{i=1}^{N} TAi + \sum_{i=1}^{N} TBi\right]\right]}{\sum_{i=1}^{N} TAi + \sum_{i=1}^{N} TBi}$$

$$= \frac{Ri}{RN}(EN)\frac{\Sigma TAi}{TI} - \frac{Ri}{RP}(EP)$$

$$Vin = \frac{Ri}{RN}(EN)\frac{(TI - \Sigma TBi)}{TI} - \frac{Ri}{RP}(EP)$$

$$= -\frac{Ri}{RN}(EN)\frac{\Sigma TBi}{TI} + \frac{Ri}{RN}(EN) - \frac{Ri}{Rp}(EP)$$

$$= -\frac{Ri}{RN}(EN)\left[\frac{\Sigma TBi}{TI} + \frac{\frac{Ri}{RN}(EN) - \frac{Ri}{Rp}(EP)}{-\frac{Ri}{RN}EN}\right]$$

$$= K1\left[\frac{\Sigma TBi}{TI} + K2\right] \tag{4}$$

EQUATION 5

$$\Sigma TBi = TI - \Sigma TAi$$

$$Vin = K1\left[\frac{TI - \Sigma TAi}{TI} + K2\right]$$

$$= K1\left[1 - \frac{\Sigma TAi}{TI} + K2\right] \tag{5}$$

EQUATION 6

(From FIG 2C)

$$TB29 \times IP = (TF - TB28)IN \qquad TB29 = \frac{IN}{IP}(TF - TB28)$$

$$TB30 \times IP = (TF - TD - TB29)IN \qquad TB30 = \frac{IN}{IP}(TF - TD - TB29) = TD + TK$$

$$TK = \frac{TB29}{TF - TB28}(TF - TD - TB29) - TD$$

$$TK(TF - TB28) = TB29(TF - TD - TB29) - TD(TF - TB28)$$

-continued $$TD(TF - TB28 + TB29) = TB29(TF - TB29) - TK(TF - TB28)$$

$$TD = \frac{TB29(TF - TB29) - TK(TF - TB28)}{TF - TB28 + TB29}$$

assume $TB28 = TB29$ $$TD = \frac{-(TB29)^2 + TB29(TF + TK) - TK \times TF}{TF}$$

EQUATION 7

From FIG 2C $$TB2 \times IP = (TF - TB1)IN \quad TB3 \times IP = (TF - TE - TB2) \times IN$$

$$TV = TB3 - TE = \frac{TF \cdot IN}{IP + IN} \quad \text{STEADY STATE CONDITION}$$

$$= \frac{TF \cdot \frac{IN}{IP}}{1 + \frac{IN}{IP}}$$

$$\frac{IN}{IP}(TF - TE - TB2) - (TE)\frac{\frac{IN}{IP}}{\frac{IN}{IP}} = \frac{(TF)\frac{IN}{IP}}{1 + \frac{IN}{IP}}$$

$$TE\left[1 + \frac{1}{\frac{IN}{IP}}\right] = TF - TB2 - \frac{TF}{1 + \frac{IN}{IP}}$$

$$\frac{IN}{IP} = \frac{TB2}{TF - TB1} \quad 1 + \frac{IN}{IP} = 1 + \frac{TB2}{TF - TB1} = \frac{TF - TB1 + TB2}{TF - TB1}$$

$$TE\left[\frac{1 + \frac{IN}{IP}}{\frac{IN}{IP}}\right] = TF - TB2 - \frac{TF(TF - TB1)}{TF - TB1 + TB2}$$

$$TE = \frac{TB2}{TF - TB1}\left[\frac{TF - TB1}{TF - TB1 + TB2}\right]\left[\frac{(TF - TB2)(TF - TB1 + TB2) - TF(TF - TB1)}{TF - TB1 + TB2}\right]$$

$$= TB2\left[\frac{TF \cdot TB2 - TB2 \cdot TF + TB2 \cdot TB1 - (TB2)^2}{(TF - TB1 + TB2)^2}\right]$$

$$= \frac{-(TB2)^2(TB2 - TB1)}{(TF + TB2 - TB1)^2}$$

What is claimed is:

1. An analog-to-digital converter comprising:
   integrator means for producing an output signal and having a summing input and a voltage input,
   input network means for applying a first current flow in a first direction to the integrator means summing input and a voltage to the integrator means voltage input, and having an input network means switch control input for switching to a second current flow in a second direction opposite to said first direction, said input network means having an analog signal input permanently connected to said integration means except during a period of calibration,
   control means for periodically applying a logic level to the input network means switch control input,
   detection means for signalling when said output signal reaches a reference level, and for applying an opposite logic level to the input network means switch control input when said output signal reaches said reference level,
   timing means for measuring a first amount of time from an initial occurrence of said output signal reaching said reference level until a subsequent occurrence of said output signal reaching said reference level, said timing means being capable of measuring said time in an integration period closely approximately a predetermined time period,
   means for measuring a second amount of time said first current is in said first direction during said integration period, and
   electronic means for calculating a digital representation of the analog input signal based upon the measured first amount of time and second amount of time.

2. The analog to digital converter of claim 1, wherein the means for applying a first and second direction of current flow includes means for coupling and uncoupling a reference signal to the integrator summing input.

3. The analog to digital converter of claim 2, wherein the means for periodically applying a logic level includes means for producing an integral number of fixed time intervals in said predetermined period, and causing a bistable element to assume said logic level at the beginning of each fixed interval.

4. The analog to digital converter of claim 3, wherein the means for detection includes a comparator with one input coupled to receive the integrator means output signal and the other input of the comparator coupled to receive said reference level and having an output.

5. The analog to digital converter of claim 4, wherein the control means for applying a logic level includes means responsive to the comparator output causing said bistable element to assume an opposite logic level.

6. The analog to digital converter of claim 5, wherein the timing means for measuring said second amount of time includes a counter having a clock input, said counter enabled for accumulation of clock pulses only during a predetermined state of said bistable element of each fixed time interval.

7. The analog to digital converter of claim 6, wherein the timing means for measuring said first amount of time includes means for using said counter to determine an increment of time from the end of said predetermined period to the end of said integration period, said increment compared to its saved value from the previous said integration period and the arithmetic difference added to the predetermined period.

8. The analog-to-digital converter of claim 1, wherein the control means for applying a first current flow in a first direction and a second current flow in a second direction opposite to said first direction includes means for either coupling a first reference signal to, and uncoupling a second referenced signal from, or uncoupling a first reference signal from, and coupling a second reference signal to, the integrator summing input.

9. The analog-to-digital converter of claim 1, wherein the means for applying a first current flow in a first direction and a second current flow in a second direction opposite said first direction includes means for either coupling a first reference signal to, and uncoupling a second reference signal from, or uncoupling a first reference signal from, and coupling a second reference signal to, the integrator voltage input.

10. The analog-to-digital converter of claim 1, wherein said input network means further comprises an offset current for ensuring said first and second current flows consist of values providing system stability over the analog input signal range.

11. An analog-to-digital converter, comprising;
    integrator means for producing an output signal and having a summing input and a voltage input,
    input network means for applying a first current flow in a first direction to the integrator means, said input network means having an analog signal input permanently connected to said integrator means except during a period of calibration and including reference voltages and a switch control input for switching to a second current flow in a second direction opposite to said first direction,
    bistable element means for controlling said switch control input, said bistable element means having a first state and a second state,
    external counter means for accumulating time during said second state, said external counter means including a clock input and having an output,
    comparator means for sensing a relative polarity between the integrator means output and a reference value and causing the bistable element means to switch to said first state for a predetermined sense,
    computer control means for causing the bistable element means to switch to a second state and for counting the external counter output, said computer control means further including,
    means for causing the bistable element means to switch periodically to said second state at the end of each of a predetermined number of fixed time intervals,
    means for measuring an integration period comprising a total amount of time occurring when the bistable element means switches from its second to first states in a first fixed time interval until said bistable element means switches from the second state to the first state following the last of said predetermined number of fixed time intervals,
    means for accumulating the total amount of time the bistable element means is in said second state during the integration period, and
    means for calculating a digital representation of the analog input from the total amounts of time measured by the integration period measuring means and the total time accumulation means.

12. The analog to digital converter of claim 11, wherein the first instruction means includes means for causing the bistable element means to switch to said second state at other than the end of the last of the predetermined number of fixed time intervals by the amount of a correction time, first instruction means further including a fifth instruction means for calculating said correction time based on the time of said second state of an intermediate fixed time interval.

13. The analog to digital converter of claim 12, wherein the first instruction means includes means for causing the bistable element means to switch to said second state at other than the end of an intermediate fixed time interval by the amount of a time correction, first instruction means further including a sixth instruction means for calculating said time correction based on the times of said second state of intermediate fixed time intervals.

14. The analog to digital converter of claim 13, further comprising select circuit means for uncoupling an analog input signal and coupling alternate input signals, wherein the computer control means includes means for controlling the select circuit means.

15. The analog to digital converter of claim 11, wherein third instruction means accumulates the total amount of time the bistable element means is in said first state during the integration period.

16. An analog-to-digital converter having a repeating conversion cycle of a predetermined period, comprising:
    integrator means for producing an output signal and having a summing input and voltage input,
    input network means for applying a current flow to the integrator, said input network means except during a period of calibration having an analog signal input continuously coupled to said integrator during the period of each conversion cycle,
    summing input means having a switch control input for switching said current flow applied to said integrator from a first direction to a second direction opposite to said first direction,
    control means for applying a logic level to the switch control input,
    means for signalling when said output signal reaches a reference level, and for applying an opposite logic level to the switch control input, timing means for measuring a first amount of time represented as an integration period occurring between said output signal leaving and returning a predetermined reference level, means for measuring a second amount of time said first current flow is in said first direction during said direction, and electronic means for calculating a digital representation of an analog input signal based upon the measured first amount of time and second amount of time.

17. The analog to digital converter of claim 16, wherein the means for applying first and second direction of current flow includes means for coupling and uncoupling a reference signal to the integrator summing input.

18. The analog to digital converter of claim 17 wherein the means for applying a logic level includes means for producing an integral number of fixed time intervals in said predetermined period.

19. The analog to digital converter of claim 18 wherein the means for detection include a comparator with one input coupled to receive the integrator means output signal and the other input of the comparator coupled to receive a reference level.

20. The analog to digital convertor of claim 19, wherein the control means for applying a logic level includes means responsive to the comparator output causing said bistable element to assume an opposite logic level.

21. The analog to digital converter of claim 20, wherein the timing means for measuring said second amount of time includes a counter having a clock input, said counter enabled for counting of clock pulses during a predetermined state of said bistable element of each time period.

22. The analog to digital converter of claim 21 wherein the timing means for measuring said first amount of time includes means for using said counter to determine an increment of time in each period said increment being compared to a saved value from the previous period and the arithmetic difference added to the previous period.

23. The analog-to-digital converter of claim 16, wherein said input network means further comprises electronic means for insuring that said current flow in said first direction is always greater than said current flow in said second direction, thus providing system stability over an analog input signal an analog input signal range of said analog-to-digital converter.

24. An analog-to-digital converter comprising:

an integrator circuit for producing an output signal and having a summing input and a voltage input;

an input network for applying a first current flow in a first direction to the integrator circuit summing input and a voltage to the integrator circuit voltage input, and having an input network switch control input for switching to a second current flow in a second direction opposite to said first direction, said input network except during a period of calibration having an analog signal input continuously coupled to said integrator circuit, a control circuit for periodically applying a logic level to the input network switch control input, a detection circuit for signalling when said output signal reaches a reference level, and for applying an opposite logic level to the input network switch control input when said output signal reaches said reference level, a first timing circuit for measuring a first amount of time from an initial occurrence of said output signal reaching said reference level until a subsequent occurrence of said output signal reaching said reference level, said timing circuit being capable of measuring said time in an integration period closely approximating a predetermined time period, a second timing circuit for measuring a second amount of time said first current flow is in said first direction during said integration period, and a circuit for calculating a digital representation of the analog input signal based upon the measured first amount of time and second amount of time.

25. An analog-to-digital converter comprising:

integrator means for producing an output signal and having a summing input and a voltage input, input network means for applying a first circuit flow to the integrator means summing input and a voltage to the integrator means voltage input, and having an input network means switch control input for switching to a second current flow, said input network means except during a period of calibration having an analog signal input continuously coupled to said integration means, control means for periodically applying a logic level to the input network means switch control input, detection means for signalling when said output signal reaches a reference level, and for applying an opposite logic level to the input network means switch control input when said output signal reaches said reference level, timing means for measuring a first amount of time from an initial occurrence of said output signal reaching said reference level until a subsequent occurrence of said output signal reaching said reference level, said timing means being capable of measuring said time in an integration period closely approximating a predetermined time period, means for measuring a second amount of time corresponding to the time said first current flow is in a predetermined direction during said integration period, and electronic means for calculating a digital representation of the analog input signal based upon the measured first amount of time and second amount of time.

26. An analog-to-digital converter comprising:

an integrator circuit for producing an output signal and having a summing input and a voltage input;

an input network for applying a first current flow in a first direction to the integrator circuit summing input and a voltage to the integrator circuit voltage input, and having an input network switch control input for switching to a second current flow in a second direction opposite to said first direction, said input network except during a period of calibration having an analog signal input representative of a measured voltage continuously coupled to said integrator circuit, a control circuit for periodically applying a logic level to the input network switch control input, a detection circuit for signalling when said output signal reaches a reference level, and for applying an opposite logic level to the input network switch control input when said output signal reaches said reference level, a first timing circuit for measuring a first amount of time from an initial occurrence of said output signal reaching said reference level until a subsequent occurrence of said output signal reaching said reference level, said timing circuit being capable of measuring said time in an integration period closely approximating a predetermined time period, a second timing circuit for measuring a second amount of time said first current flow is in said first direction during said integration period, and a circuit for calculating a digital representation of the analog input signal based upon the measured first amount of time and second amount of time.

* * * * *